(12) United States Patent
Goida et al.

(10) Patent No.: US 9,079,760 B2
(45) Date of Patent: Jul. 14, 2015

(54) INTEGRATED MICROPHONE PACKAGE

(71) Applicant: Invensense, Inc., San Jose, CA (US)

(72) Inventors: Thomas M. Goida, Windham, NH (US); Jason P. Fiorillo, Wellesley, MA (US)

(73) Assignee: INVENSENSE, INC., San Jose, CA (US)

(*) Notice: Subject to any disclaimer, the term of this patent is extended or adjusted under 35 U.S.C. 154(b) by 0 days.

(21) Appl. No.: 13/922,955

(22) Filed: Jun. 20, 2013

(65) Prior Publication Data

US 2014/0169607 A1     Jun. 19, 2014

Related U.S. Application Data

(60) Provisional application No. 61/738,209, filed on Dec. 17, 2012.

(51) Int. Cl.
| | |
|---|---|
| B81B 3/00 | (2006.01) |
| H04R 1/02 | (2006.01) |
| H04R 19/00 | (2006.01) |
| H04R 19/04 | (2006.01) |
| H04R 1/08 | (2006.01) |

(52) U.S. Cl.
CPC .............. *B81B 3/0027* (2013.01); *H04R 1/021* (2013.01); *H04R 19/005* (2013.01); *H04R 19/04* (2013.01); *H04R 1/083* (2013.01); *H04R 1/086* (2013.01)

(58) Field of Classification Search
CPC ............ H04R 1/04; H04R 1/02; H04R 31/00; H04R 19/04
USPC ......... 381/356, 361, 150, 341, 344, 174, 365, 381/175, 374, 352, 160, 355
See application file for complete search history.

(56) References Cited

U.S. PATENT DOCUMENTS

| | | | |
|---|---|---|---|
| 7,434,305 B2* | 10/2008 | Minervini | 29/594 |
| 8,295,527 B2* | 10/2012 | Chen | 381/365 |
| 2003/0015729 A1* | 1/2003 | Bosco et al. | 257/190 |
| 2007/0082421 A1* | 4/2007 | Minervini | 438/50 |
| 2008/0087979 A1* | 4/2008 | Goida et al. | 257/502 |
| 2010/0253437 A1* | 10/2010 | Seeger et al. | 331/18 |
| 2011/0210409 A1* | 9/2011 | Minervini | 257/416 |
| 2012/0027234 A1* | 2/2012 | Goida | 381/150 |
| 2012/0326248 A1* | 12/2012 | Daneman et al. | 257/415 |
| 2013/0129136 A1 | 5/2013 | Harney et al. | |
| 2013/0195284 A1* | 8/2013 | Yang et al. | 381/91 |
| 2014/0072152 A1* | 3/2014 | Yang et al. | 381/174 |

FOREIGN PATENT DOCUMENTS

WO    WO 2008067431 A2 *   6/2008   ............ H04R 19/00

\* cited by examiner

*Primary Examiner* — Davetta W Goins
*Assistant Examiner* — Amir Etesam
(74) *Attorney, Agent, or Firm* — Maryam Imam; IPxLaw Group LLP

(57) ABSTRACT

An apparatus has a packaged microphone with a base and a lid that at least in part form an interior chamber containing a microphone die. The base has a bottom surface with an electrical interface and a base aperture. The apparatus also has a device housing having an internal surface, and a filter extending between the internal surface of the device housing, through an underlying substrate, and the bottom surface of the base.

18 Claims, 6 Drawing Sheets

INTEGRATED MICROPHONE PACKAGE

PRIORITY

This patent application claims priority from provisional U.S. patent application Ser. No. 61/738,209, filed Dec. 17, 2012, entitled, "PACKAGED MICROPHONE," and naming Thomas Goida and Jason Fiorillo as inventors, the disclosure of which is incorporated herein, in its entirety, by reference.

FIELD OF THE INVENTION

The invention generally relates to microphones and, more particularly, the invention relates to packages for microphones.

BACKGROUND OF THE INVENTION

MEMS microphones are used in a growing number of devices, such as mobile telephones, laptop computers, voice recorders, hearing instruments, and other electronic devices. To those ends, MEMS microphone dice typically are mounted within a package interior and controlled by an adjacent integrated circuit die. For example, a MEMS microphone package may include a substrate, such as a BT or FR-4 based printed circuit board (PCB), a MEMS microphone die attached to the substrate, and a cup-shaped lid attached to the substrate to create a package. The interior of the package forms an interior chamber that protects the fragile MEMS microphone die from the environment.

SUMMARY OF VARIOUS EMBODIMENTS

In accordance with one embodiment of the invention, an apparatus has a packaged microphone with a base and a lid that at least in part form an interior chamber containing a microphone die. The base has a bottom surface with an electrical interface and a base aperture. The apparatus also has a housing having an internal surface, and a filter extending between the internal surface of the housing and the bottom surface of the base.

Among other things, the housing may be a mobile telecommunication device housing. The base also may have a top surface within the interior chamber. Accordingly, the base aperture may extend from the top surface of the base to the bottom surface of the base, and the microphone die may be secured to the top surface of the base. For example, the microphone die may be secured to the base top surface to substantially cover the base aperture.

The apparatus also may have substrate with electrical interconnects and a substrate opening. The filter may extend through the substrate opening to contact both the internal surface of the housing and the bottom surface of the base. Alternatively or in addition, the electrical interface of the base may be both in contact with the substrate and in electrical communication with the electrical interconnect. For example, the electrical interface of the base may be surface mounted to the substrate.

Some embodiments may have adhesive connecting the filter to the bottom surface of the base. Moreover, the housing may form a housing aperture. In that case, the filter may form an acoustic channel between the housing aperture and the base aperture. Alternatively or in addition, the filter may form or define a first portion and a second portion of the bottom surface of the base—the first portion is covered by the filter, while the second portion is free of the filter (i.e., not covered by the filter). The apparatus may also have a ground pad formed on the second portion of the bottom surface of the base.

In accordance with another embodiment, an apparatus has a packaged microphone with a package that forms an interior chamber containing a microphone die. The package also has a bottom surface having an electrical interface and a package aperture. The apparatus also has a device housing with both an internal surface and a housing aperture, and a filter secured between the internal surface of the housing and the bottom surface of the package. The filter forms an acoustic channel between the housing aperture and the package aperture.

In accordance with other embodiments, a method of assembling a device provides a packaged microphone with a package that forms an interior chamber containing a microphone die. The package has a bottom surface and a package aperture extending through the bottom surface. To communicate with other devices, the bottom surface has an electrical interface. The method also electrically connects the electrical interface of the package with a substrate having a plurality of interconnects, and mounts the substrate and packaged microphone relative to a device housing having an interior housing surface and a housing aperture. Among other things, when mounting the substrate and packaged microphone, the method positions a filter between the interior housing surface and the bottom surface of the package. The filter forms an acoustic channel between the package aperture and the housing aperture.

BRIEF DESCRIPTION OF THE DRAWINGS

Those skilled in the art should more fully appreciate advantages of various embodiments of the invention from the following "Description of Illustrative Embodiments," discussed with reference to the drawings summarized immediately below.

DESCRIPTION OF ILLUSTRATIVE EMBODIMENTS

In illustrative embodiments, a device forms a direct acoustic channel from an aperture in its external device housing, to an aperture in its internal packaged microphone. To that end, the device has a filter that extends from the bottom side of the internal packaged microphone, through or around a printed circuit board to which the packaged microphone is mounted, and terminates on the interior side of the device housing (e.g., the housing of a smartphone). Some implementations may use an adhesive to improve the connection between filter and the package and/or housing surfaces. Other embodiments do not have the filter, sometimes directly contacting the packaged microphone with the device housing.

Accordingly, this solution favorably eliminates an extra component—a sealing ring or other similar component between the packaged microphone and the printed circuit board—simplifying fabrication, improving device reliability, and reducing costs. Details of various embodiments are discussed below.

Figure 1:
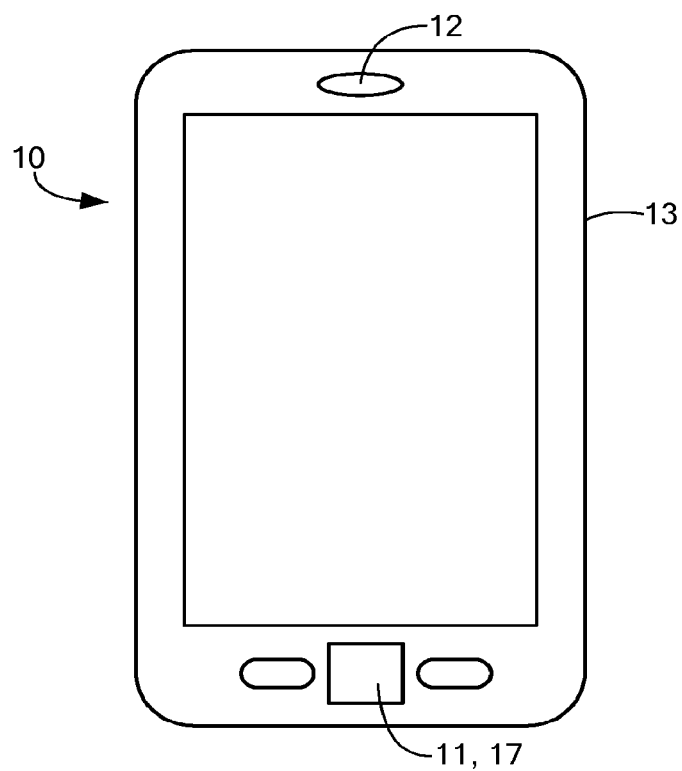
FIG. 1 schematically shows a mobile device that may be configured in accordance with illustrative embodiments of the invention.

FIG. 1 schematically shows a smartphone 10 that can be configured and produced in accordance with illustrative embodiments. It should be noted, however, that discussion of a smartphone 10 and its various components (e.g., a microphone die and printed circuit board, discussed below) is for illustrative purposes only and thus, not intended to limit all embodiments of the invention. Various embodiments thus apply to other types of devices, such as, among other things, mobile telephones, tablets, personal digital assistants ("PDAs"), game handsets and consoles, headsets, computers, hand-held microphone systems, televisions, radios, etc. Accordingly, more generic terms, such as "device 10," may be used to describe an apparatus that uses various embodiments.

In simplified terms, the smartphone 10 has a receiver 11 for receiving sound (e.g., a person's voice), a speaker portion 12 for generating sound, and internal circuitry (some portion of which is discussed below) for transmitting and receiving electromagnetic signals encoding incoming sound. Each of these components are at least in part encased within a device housing 13 generally formed from a conventional housing material, such as glass, plastic, metal, rubber, or a combination of materials. The device housing 13 forms a housing opening 17 (identified for convenience as part of the receiver 11) for receiving incoming sound, which in turn is received and processed by the rest of the receiver 11.

Figure 2:
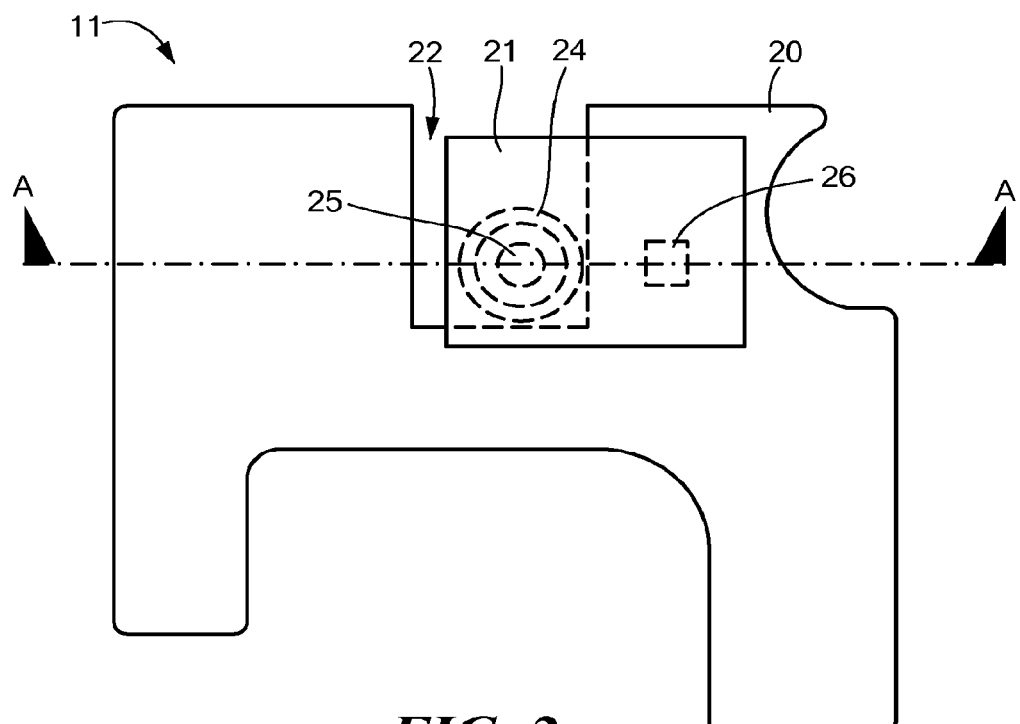
FIG. 2 schematically shows a plan view of a portion of a device receiver, which includes a printed circuit board supporting a packaged microphone in accordance with illustrative embodiments of the invention.

During use, a person may speak into the housing opening 17, which forms the beginning of an acoustic channel that terminates at an internally mounted packaged microphone 21 (FIG. 2 and others, discussed below). As a transducer, the packaged microphone 21 converts sound into an electrical signal for further processing. Internal logic (not shown) modulates this signal to a remote source, such as to a satellite tower and, ultimately, to another person using another telephone 10.

FIG. 2 schematically shows an internal portion of the receiver 11 in accordance with one embodiment of the invention. Specifically, FIG. 2 schematically shows a plan view of a substrate 20 supporting and electrically interconnecting the above noted packaged microphone 21 with additional electronic components (e.g., passive components, active components, or other integrated circuits). The packaged microphone 21 cooperates with on-board and off-board circuitry to convert and deliver incoming sound to other systems. For illustrative purposes, the substrate 20 is discussed as being a printed circuit board. Those skilled in the art should understand that such a characterization is but one of a number of different types of printed circuit boards. Accordingly, discussion of a printed circuit board, or a specific type of printed circuit board, is not intended to limit the meaning of "substrate 20." For example, the substrate 20 may include a flexible substrate.

Those in the art recognize that space is limited within a smartphone 10. The printed circuit board 20 thus preferably is shaped in a manner to efficiently fit within the interior of the device housing 13. Accordingly, some embodiments shape the printed circuit board 20 in an irregular manner (or other prescribed manner) that complies with the interior space allotted to the board 20 within the device housing 13.

Prior art designs often required an airtight seal between their packaged microphones and the substrates. To that end, these prior art devices often soldered a sealing ring between their microphone package and substrate very near their package aperture. Among other reasons, this airtight seal was important to avoid sound leakage that could cause vibration between the substrate and the bottom of the package. Moreover, this soldering operation often led to unintended consequences. For example, this soldering operation often introduced solder flux into the interior chamber (through the package aperture), catastrophically damaging the fragile MEMS microstructure of the internal microphone die within the packaged microphone. Use of such a sealing ring therefore often reduced device reliability and yield, increasing ultimate device costs.

The inventors recognized this problem and discovered a solution that completely eliminates the need for a sealing ring and its attendant soldering processes. In particular, the inventors formed an opening or contour (both referred to simply as a "board opening 22") in the printed circuit board 20 that exposes the bottom surface of the packaged microphone 21 to the device housing 13. In some such embodiments, the board opening 22 has an inner dimension (e.g., its diameter) that is larger than the inner dimension of the input aperture 25. For example, the inner dimension of the board opening 22 may be two times or larger, three times or larger, or four times or larger than the inner dimension of the input aperture 25. Some embodiments may have a board opening inner dimension that is between two and twenty times larger than the input aperture input aperture 25.

The acoustic channel 70 (FIG. 7, discussed in detail below) effectively formed from the housing opening 17 to the packaged microphone 21 therefore bypasses the printed circuit board 20—extending directly between the housing opening 17 to the input aperture 25 of the packaged microphone 21. Thus, there no longer is a substrate beneath the entire packaged microphone 21, consequently eliminating a source of vibration. No sealing ring thus is necessary, consequently permitting a more direct sound channel to the transducer. This solution also avoids soldering very near the input aperture 25 of the packaged microphone 21.

To those ends, illustrative embodiments form the noted acoustic channel 70 to include an optional filter 24 that extends from the housing opening 17 in the receiver 11, through the board opening 22, and to the packaged microphone 21. The filter 24 (shown in phantom in FIG. 2) and acoustic channel 70 are discussed in greater detail below with regard to FIGS. 7-10.

Those skilled in the art can mount the packaged microphone 21 onto the printed circuit board 20 using any of a variety of different known techniques. For example, surface mount technology or lead-through-board technologies (e.g., gull wing mounting) should suffice. Moreover, it should be noted that only the packaged microphone 21 is shown for simplicity. Those skilled in the art should understand that the circuit board 20 may have many other components, such as additional microphones, resistors, capacitors, transistors, application-specific integrated circuits, traces, contact pads, etc.

Indeed, as its name suggests, the packaged microphone 21 has a microphone package 30 that contains circuitry to receive and transduce incoming sound. For example, this embodiment has both a MEMS microphone die 50 and circuit die 71, such as an application specific internal circuit. Illustrative embodiments may use a variety of different types of MEMS microphone dice, such as that shown by example in FIGS. 5 and 6 (discussed in detail below).

Figure 3:
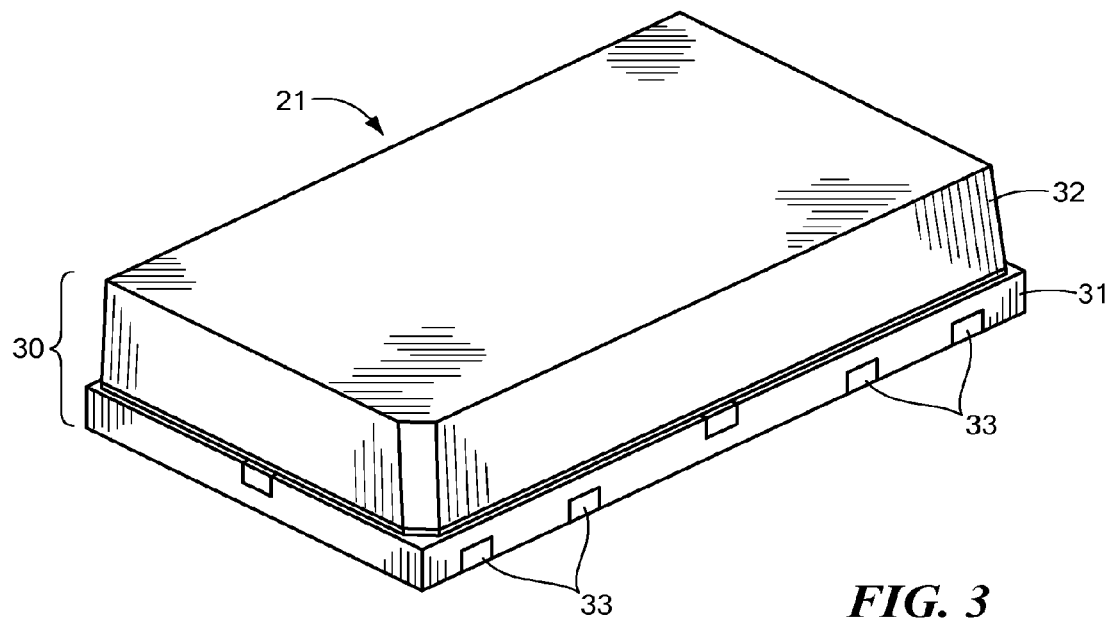
FIG. 3 schematically shows a top perspective view of a packaged microphone that may be configured in accordance with illustrative embodiments of the invention.

To those ends, FIG. 3 schematically shows a top, perspective view of a packaged microphone 21 that may be configured in accordance with illustrative embodiments of the invention. In a corresponding manner, FIG. 4 schematically shows a bottom, perspective view of the same packaged microphone 21.

The packaged microphone 21 shown in those figures has a package base 31 that, together with a corresponding lid 32, forms an interior chamber 72 (see FIGS. 7 and 9, discussed below) containing the noted microphone die 50 and, if desired, the noted separate circuit die 71. Alternatively, the microphone die 50 has on-chip circuitry, thus obviating the need for separate microphone circuitry within the chamber 72. The lid 32 in this embodiment is a cavity-type lid, which has four walls extending generally orthogonally from a top, interior face to form a cavity. The lid 32 secures to the top face of the substantially flat package base 31 to form the interior chamber 72. In alternative embodiments, the lid 32 and base 31 combine with other elements (e.g., an intervening wall between the lid 32 and the base 31) to form the interior chamber 72. Other embodiments may implement the base 31 as a cavity package (with a bottom and walls extending from a flat surface), and/or the lid 32 in a generally flat planar shape.

Figure 4:
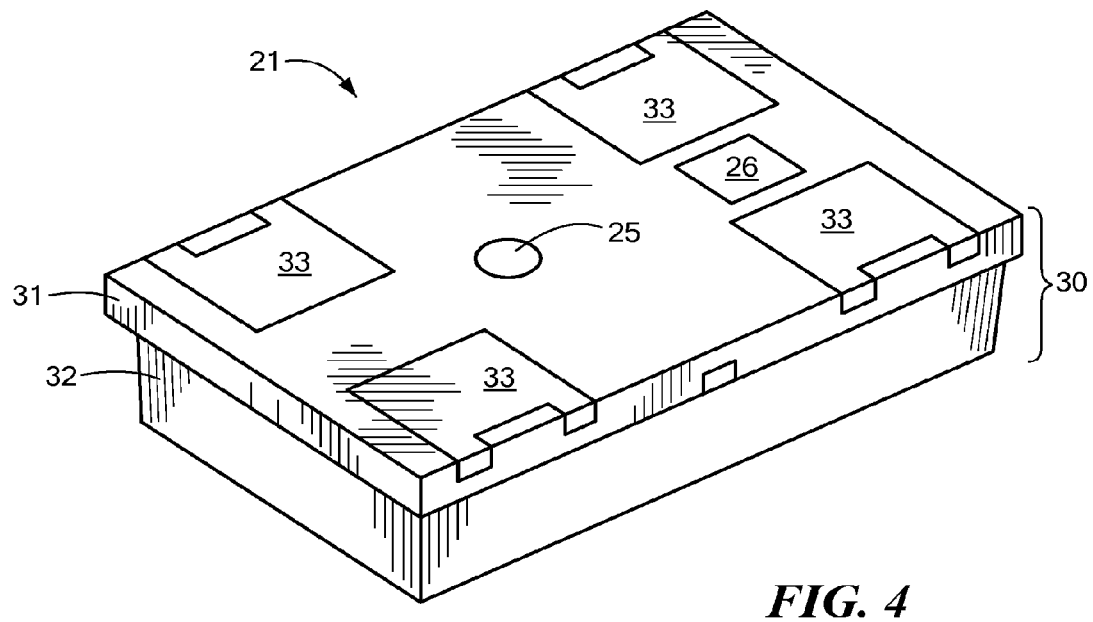
FIG. 4 schematically shows a bottom perspective view of the packaged microphone shown in FIG. 2.

FIG. 4, which shows the bottom side of the packaged microphone 21, details how the base 31 has sound input aperture 25 that enables ingress of sound into the interior chamber 72. This type of packaged microphone 21 thus often is referred to in the art as a "bottom port microphone" due to the location of the input aperture 25, and the microphone die 50. Sound entering the interior chamber 72 interacts with the microphone die 50 to produce an electrical signal that, with additional (exterior) components (e.g., a speaker and accompanying on-chip or off-chip circuitry), produce output sound corresponding to the input sound.

In alternative embodiments, the package 30 has two or more apertures 25. For example, the package 30 could have a second input aperture 25 (not shown) for directional sound purposes. Accordingly, discussion of a package 30 having a single input aperture 25 through the base 31 is but one example of a variety of different embodiments.

FIG. 4 also shows a number of base contacts 33 for electrically (and physically, in many anticipated uses) connecting the packaged microphone 21 with a substrate, such as the printed circuit board 20 of FIG. 2 or other electrical interconnect apparatus. Among other things, the base contacts 33 may include surface mountable pads or leads.

The package 30 shown in FIGS. 3 and 4 may be implemented by any of a number of different packaging technologies, such as among other types, ceramic cavity packages, substrate packages, carriers, flex, pre-molded or post-molded leadframe packages, or laminate base (e.g., BT) packages. Accordingly, discussion of a specific type of package base is for illustrative purposes only.

The package 30 may have selective metallization to protect it from electromagnetic interference ("EMI"). For example, the lid 32 could be formed mainly from stainless steel, while the base 31 could include printed circuit board material, such as metal layers and FR-4 substrate material. Alternatively, the lid 32 may be formed from an insulator, such as plastic, with an interior conductive layer. Other embodiments contemplate other methods for forming an effective Faraday cage that reduces the amount of EMI within the interior chamber 72. Moreover, various embodiments may form the base 31 and lid 32 from similar or the same materials. For example, both can be formed from a laminate, or the lid 32 can be formed from a laminate, while the base 31 can be formed from a carrier or pre-molded leadframe.

Figure 5:
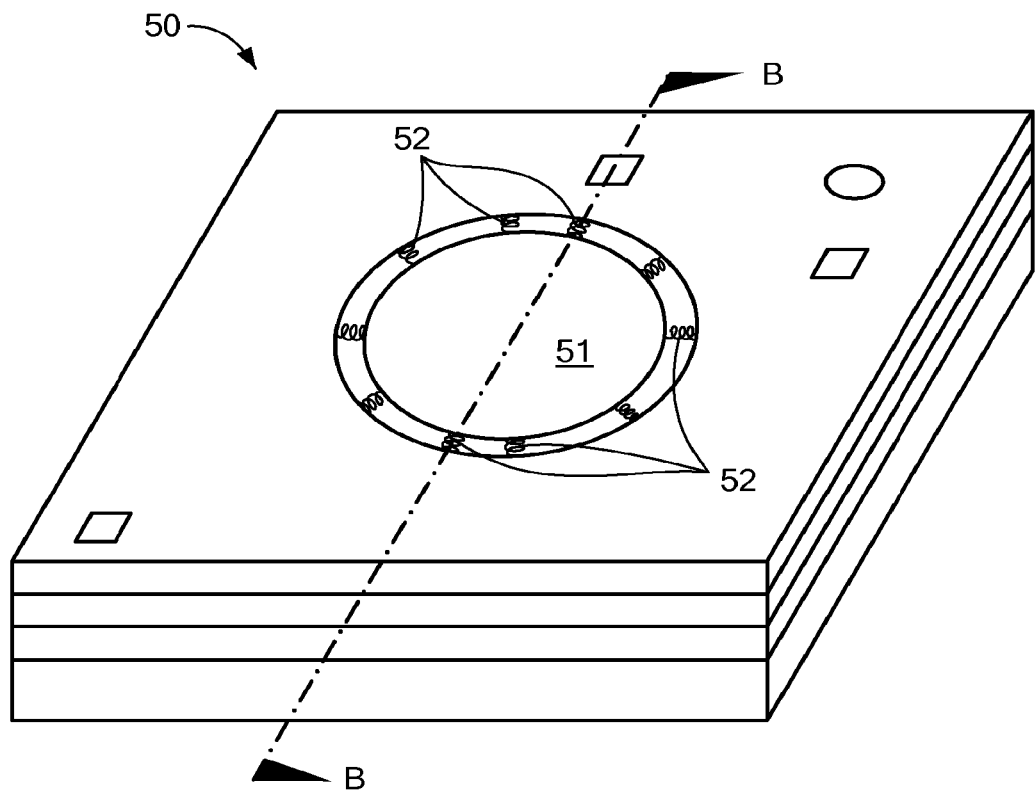
FIG. 5 schematically shows a perspective view of a microphone die that may be used in accordance with illustrative embodiments of the invention.
Figure 6:
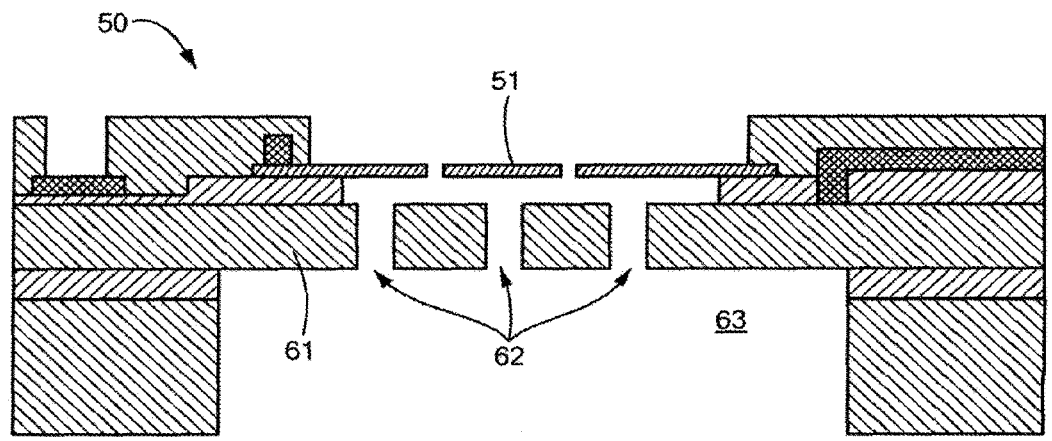
FIG. 6 schematically shows a cross-sectional view of the microphone die shown in FIG. 4.

The interior chamber 72 can contain any of a variety of different types of microphone dice. As an example, FIG. 5 schematically shows a perspective view of one type of microphone die 50 that may be used in illustrative embodiments. FIG. 6 schematically shows a cross-sectional view of the same microphone die 50.

The microphone die 50 includes a single static backplate 61 that supports and forms a variable capacitor with a flexible diaphragm 51. In illustrative embodiments, the backplate 61 is formed from single crystal silicon (e.g., the top layer of a silicon-on-insulator wafer; a "SOI" wafer), while the diaphragm 51 is formed from deposited polysilicon. Other embodiments, however, use other types of materials to form the backplate 61 and the diaphragm 51. For example, a single crystal silicon bulk wafer, or some deposited material may form the backplate 61. In a similar manner, a single crystal silicon bulk wafer, part of a silicon-on-insulator wafer, or some other deposited material may form the diaphragm 51. To facilitate operation, the backplate 61 has a plurality of through-holes 62 that lead to a backside cavity 63. In addition, depending on the mounting orientation of the microphone die 50, these through-holes 62 also can have the secondary function of acting as a filter that helps prevent debris from contacting the diaphragm 51.

Springs 52 movably connect the diaphragm 51 to the static portion of the microphone die 50, which includes the backplate 61. Other embodiments have no springs. Sound causes the diaphragm 51 to vibrate, thus producing a changing capacitance. On-chip or off-chip circuitry (e.g., the circuit die 71, among other things) receives and converts this changing capacitance into electrical signals that can be further processed.

It should be noted that discussion of the specific microphone die 50 shown in FIGS. 5 and 6 is for illustrative purposes only. For example, as noted above, the microphone die 50 may have multiple sub-diaphragms 51 facing multiple-sub-backplates 61, or be formed from a bulk silicon wafer and not from an SOI wafer. Other microphone configurations thus may be used with illustrative embodiments of the invention.

Figure 7:
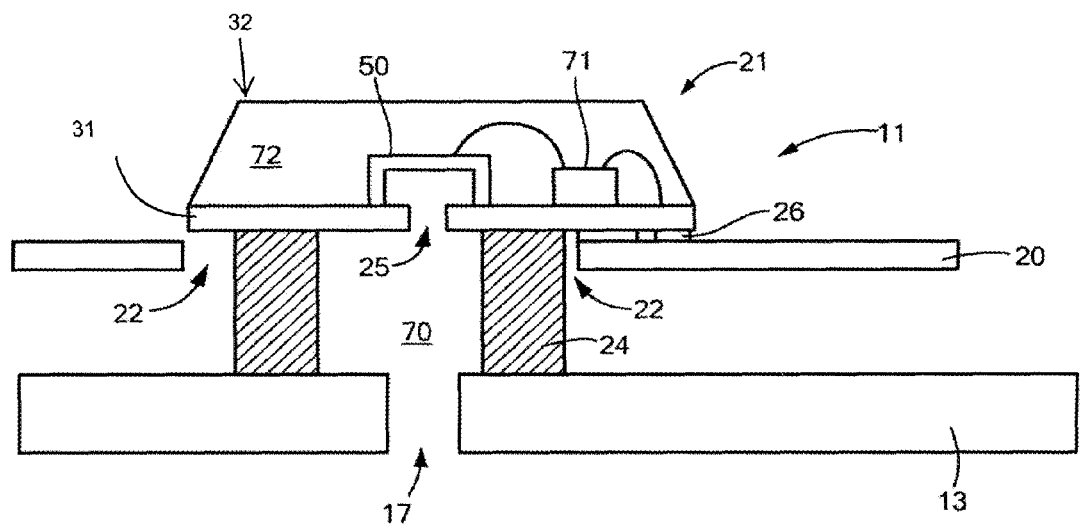
FIG. 7 schematically shows a cross-sectional view of the portion of the receiver shown in FIG. 2 along cross-section line A-A.

FIG. 7 schematically shows a cross-sectional view of the portion of the receiver 11 shown in FIG. 2 along cross-section line A-A. This view more clearly shows the relationship of the device housing 13, filter 24, printed circuit board 20, and packaged microphone 21. Specifically, with reference to FIGS. 2 and 7, although it is mechanically supported by the printed circuit board 20, a portion of the bottom face of the package base 31 is exposed to the interior face of the device housing 13 through the board opening 22. In fact, this embodiment shows how the periphery of the packaged microphone 21 also is not directly mechanically supported by the printed circuit board 20. In this embodiment, for example, the printed circuit board 20 completely supports two sides of the packaged microphone 21, while two other sides of the packaged microphone 21 are at most partially supported. The packaged microphone 21 thus has a portion that overhangs the board opening 22. Despite this overhang, conventional surface mounting processes provide a stable mechanical connection to the packaged microphone 21 on its underlying printed circuit board 20.

Moreover, with its direct connection to the bottom of the package base 31, some embodiments of the filter 24 also structurally support the packaged microphone 21 within the device housing 13. For example, when the substrate 20 is formed at least in part from a flexible substrate, then the filter 24 may provide the structural support generally to maintain the packaged microphone 21 in its intended position. In fact, when supporting the packaged microphone 21 as noted, the filter 24 also may be considered to indirectly structurally support the substrate 20.

FIG. 7 also more clearly shows the filter 24 extending from the interior surface of the device housing 13 (about the housing opening 17), through the board opening 22, to the bottom face of the package base 31. Illustrative embodiments form the filter 24 from fiberglass, rubber, plastic, or other material, which effectively forms part of the unsealed or sealed acoustic channel 70 (e.g., sealed if the filter 24 acts as a gasket) from the housing opening 17 to the input aperture 25 of the package 30. In fact, the filter 24 can take on any of a number of shapes/sizes/configurations. For example, the filter 24 can be porous, with open cells. As another example, the filter 24 can entirely cover the input aperture 25, or have a substantially unobstructed channel through it (e.g., having a ring or cylinder shape), permitting substantially free passage of the sound. Although not necessary, the filter 24 may be secured between the device housing 13 and packaged microphone 21 in a compressed state.

In addition to showing the filter 24 in phantom, FIG. 2 also shows, in phantom, the input aperture 25 of the packaged microphone 21, and an additional ground pad 26, which is spaced from the input aperture 25. FIG. 7 also shows one embodiment of this ground pad 26. Specifically, the outer periphery of the filter 24 is considered to circumscribe a first continuous portion of the bottom surface of the base 31. The phantom representation of the filter 24 in FIG. 2 clearly shows this first portion. The ground pad 26 preferably is positioned on a second (different) portion of the package base 31, which is contiguous with, but does not overlap, that first portion of the package base 31. This spacing favorably reduces the likelihood that solder or other debris will contaminate the interior chamber 72 of the packaged microphone 21. Other pads 33 may be similarly spaced from the aperture 25 of the packaged microphone 21.

Figure 8:
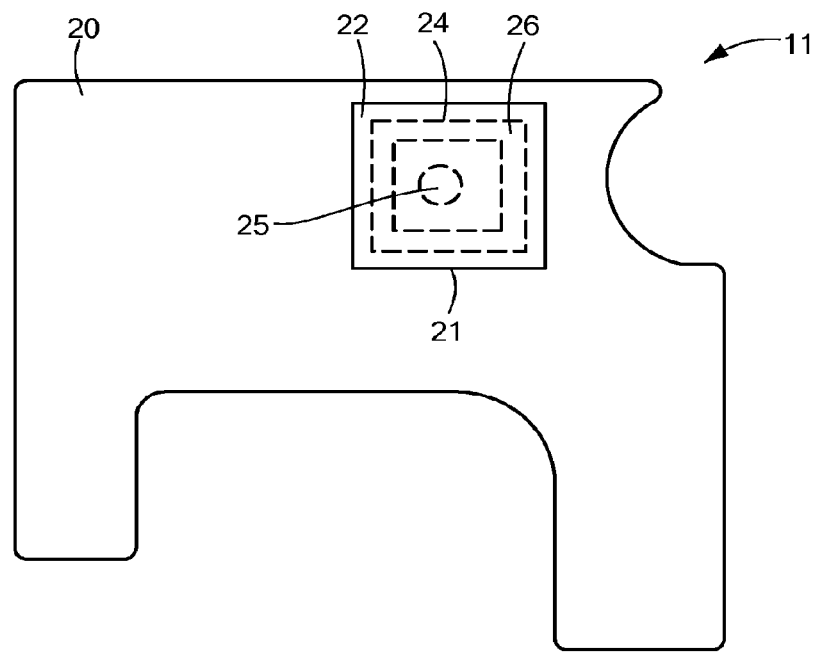
FIG. 8 schematically shows a plan view of a portion of a device receiver in accordance with another embodiment of the invention.

As noted above, other embodiments may configure or shape the board opening 22 in any of a number of different manners. Many of those embodiments nevertheless are configured and shaped to permit the filter 24 to pass through it. To that end, FIG. 8 schematically shows an additional embodiment, in which the board opening 22 is within the boundary formed by the outer edge of the printed circuit board 20. In other words, unlike the open shaped board opening 22 of FIG. 2, the board opening 22 of FIG. 8 has a closed shape. Unlike the ground pad 26 of the embodiment shown in FIG. 2, this embodiment shows the ground pad 26 positioned about the input aperture 25. This embodiment may form the ground pad 26 about one, two, three or four sides of the input aperture. Indeed, other embodiments may use either type of ground pad 26.

Moreover, although the shapes of the board openings 22 in these figures are generally rectangular, those skilled in the art can configure the board opening 22 to have any of a number of different shapes, depending on the requirements of the specific system. For example, the board opening 22 can be elliptical, triangular, or irregularly shaped. Accordingly, discussion of a single type of board opening 22 is not intended to limit various embodiments of the invention.

Figure 9:
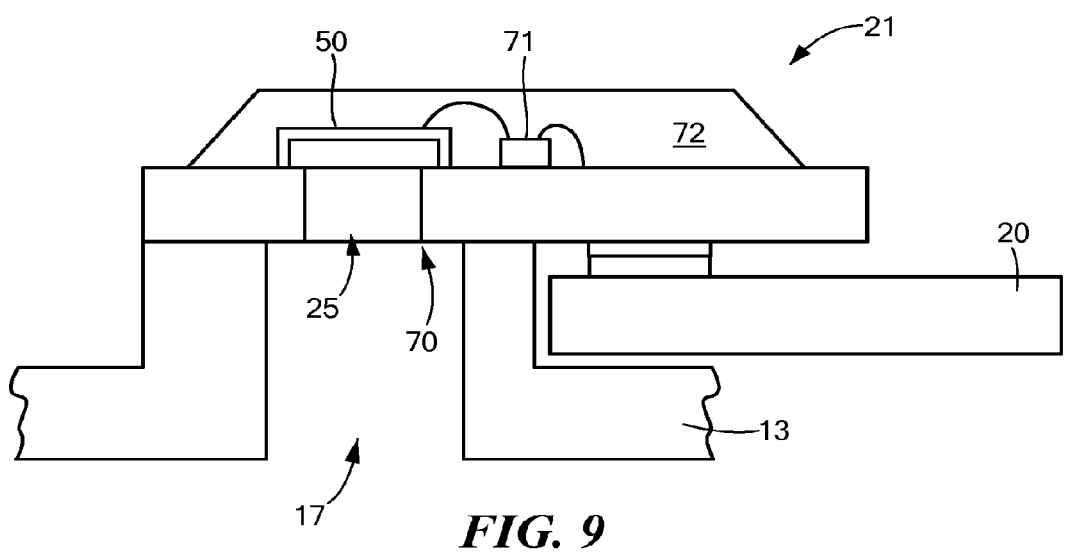
FIG. 9 schematically show another embodiment of the invention.

The distance between the device housing 13 and packaged microphone 21 can vary. When that distance is very small, those skilled in the art may form the channel 70 without the filter 24. FIG. 9 schematically shows one such embodiment in which the device housing 13 directly contacts the bottom of the package 30. Although this embodiment omits the filter 24, some embodiments still may position the filter 24 about or in the input aperture 25 in the package 30. Some such contacting embodiments may position other components between the device housing 13 and the bottom of the package 30 (e.g., an adhesive or a thin shock absorbing layer).

Figure 10:
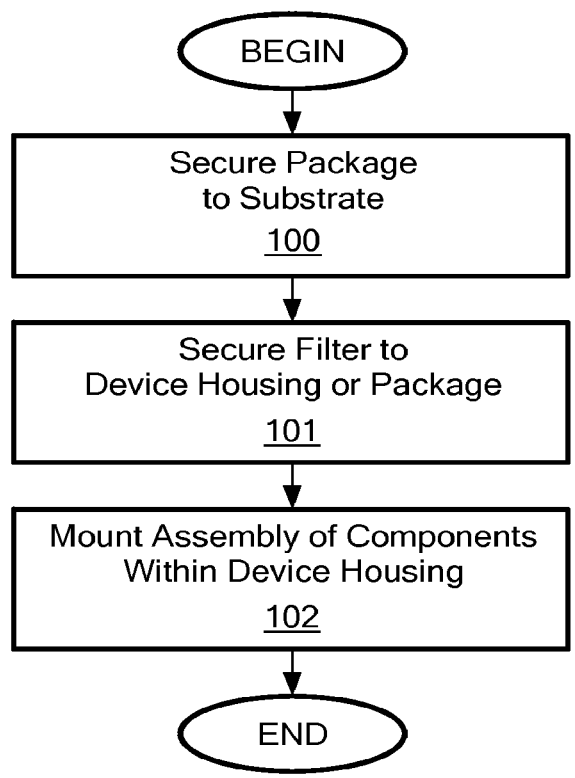
FIG. 10 shows a process of fabricating a device in accordance with illustrative embodiments of the invention.

FIG. 10 shows a process of assembling a device 10, such as a smartphone or other device 10, in accordance with illustrative embodiments of the invention. It should be noted that for simplicity, this process is a significantly simplified version of an actual process used to form the device 10. Accordingly, those skilled in the art should understand that the process may have additional steps and details not explicitly shown in FIG. 10. Moreover, some of the steps may be performed in a different order than that shown, or at substantially the same time. Those skilled in the art should be capable of modifying the process to suit their particular requirements.

The process begins at step 100, which secures the microphone package 30 to the printed circuit board 20. To that end, conventional surface mounting or non-surface mounting processes may solder or otherwise couple the pads 33 and ground pad 26 on the bottom side of the package 30 to corresponding pads on the printed circuit board 20.

Next, step 101 secures the filter 24 to the bottom face of the package base 31. In illustrative embodiments, the filter 24 has an adhesive layer on its top side to securely and directly connect with this bottom face of the base 31. When secured to the base 31, the filter 24 preferably surrounds the input aperture 25 of the package 30, thus forming the noted sealed or unsealed acoustic channel 70.

Step 101 thus may be considered to form an assembly of components (i.e., the packaged microphone 21, printed circuit board 20, and filter 24) that subsequent process steps secure within the device housing 13. Accordingly, the process concludes at step 102, in which the assembly of components is mounted within the device housing 13. More specifically, the process secures the printed circuit board 20 within the device housing 13 so that the free end of the filter 24 contacts the interior face of the device housing 13, completely surrounding the housing opening 17. This connection thus forms the acoustic channel 70 extending from the housing opening 17, through the printed circuit board 20, and to the input aperture 25 of the packaged microphone 21.

To improve this connection, the free end of the filter 24 also has an adhesive layer on its exterior surface that securely and directly connects it with the interior housing face. As noted, when the filter 24 is formed from a resilient, compressible, or flexible material, some of embodiments may mount the assembly so that the filter 24 is in a compressed state. Other embodiments, however, do not mount the filter 24 in a compressed state. For example, such other embodiments may mount the filter 24 in a normal, unbiased relaxed state (e.g., when the filter 24 is formed from an inflexible, rigid material, or when the filter 24 is formed from a resilient material).

Some embodiments may position other components between the filter 24 and the two noted surfaces to which it connects. Those additional components may also form part of the acoustic channel 70 between the device housing 13 and the packaged microphone 21. Moreover, various embodiments may omit the adhesive on one or both ends of the filter 24. Instead, those embodiments simply make surface contact with their respective surfaces/adjoining components. Mounting the filter 24 under compression should help ensure the structural integrity of this alternative design. In yet other embodiments, the filter 24 does not fully surround one or both of the housing opening 17 and the input aperture 25 of the packaged microphone 21.

Illustrative embodiments therefore eliminate the need for extra sealing rings or similar components between the packaged microphone 21 and printed circuit board 20. This reduces the number of assembly steps, eliminates one source of vibrations, and eliminates the need to solder in close proximity to the input aperture 25 of the packaged microphone 21. Eliminating this soldering step thus eliminates one risk of damaging the fragile internal MEMS components, improving product yield and reducing costs.

Although the above discussion discloses various exemplary embodiments of the invention, it should be apparent that those skilled in the art can make various modifications that will achieve some of the advantages of the invention without departing from the true scope of the invention.

What is claimed is:

1. An apparatus comprising:
a packaged microphone having a base and a lid that at least in part form an interior chamber containing a microphone die, the base having a bottom surface and a base aperture extending through the bottom surface; a device housing having an internal surface; a filter between the internal surface of the device housing and the bottom surface of the base; and a substrate having a substrate opening, the filter extending through the substrate opening to contact both the internal surface of the device housing and the bottom surface of the base wherein the substrate comprises a flexible substrate, the filter at least in part structurally supporting the flexible substrate through the contact with the bottom surface of the base.

2. The apparatus as defined by claim 1 wherein the base aperture has a base aperture inner dimension, the substrate opening having a substrate opening inner dimension that is at least two times the size of package aperture inner dimension.

3. The apparatus as defined by claim 1 wherein the base has a top surface within the interior chamber, the base aperture extending from the top surface of the base to the bottom surface of the base, the microphone die being secured to the top surface of the base.

4. The apparatus as defined by claim 3 wherein the microphone die is secured to the base top surface to substantially cover the base aperture.

5. The apparatus as defined by claim 1 wherein the substrate has an electrical interconnect, the base having a base electrical interface that is a) in contact with the substrate and b) in electrical communication with the electrical interconnect.

6. The apparatus as defined by claim 5 wherein the electrical interface of the base is surface mounted to the substrate.

7. The apparatus as defined by claim 1 further comprising adhesive connecting the filter to the bottom surface of the base.

8. The apparatus as defined by claim 1 wherein the device housing forms a housing aperture, the filter forming an acoustic channel between the housing aperture and the base aperture.

9. The apparatus as defined by claim 1 wherein the filter forms a first portion and a second portion of the bottom surface of the base, the first portion being covered by the filter, the second portion being free of the filter, the apparatus further comprising a ground pad on the second portion of the bottom surface of the base.

10. An apparatus comprising:
a packaged microphone having a package with an interior chamber containing a MEMS microphone die, the package having a bottom surface and a package aperture extending through the bottom surface; a device housing having an internal surface and a housing aperture; and a substrate coupled with the packaged microphone,
the internal surface of the device housing contacting the bottom surface of the package wherein the filter is in a state of compression between the device housing and the package and a substrate having electrical interconnects, the substrate having a substrate opening exposing at least a portion of the bottom surface of the package, the filter extending through the substrate opening to secure with both the internal surface of the device housing and the bottom surface of the package wherein the substrate comprises a flexible substrate, the filter at least in part structurally supporting the flexible substrate through the contact with the bottom surface of the base.

11. The apparatus as defined by claim 10 further comprising a filter secured between the internal surface of the device housing and the bottom surface of the package.

12. The apparatus as defined by claim 11 wherein the filter comprises a gasket.

13. The apparatus as defined by claim 11 wherein the filter forms a first portion and a second portion of the bottom surface of the package, the first portion being covered by the filter, the second portion being free of the filter, the apparatus further comprising a ground pad on the second portion of the bottom surface of the base.

14. The apparatus as defined by claim 10 wherein the package comprises a base coupled with a lid that at least in part forms the interior chamber.

15. A method of assembling a device, the method comprising: providing a packaged microphone having a package with an interior chamber containing a microphone die, the package having a bottom surface and a package aperture extending through the bottom surface, the bottom surface having an electrical interface;
electrically connecting the electrical interface of the package with a substrate having a plurality of interconnects; and
mounting the substrate and packaged microphone relative to a device housing having an interior housing surface and a housing aperture, mounting comprising positioning a filter between the interior housing surface and the bottom surface of the package, the filter forming an acoustic channel between the package aperture and the housing aperture wherein the substrate comprises a flexible substrate, the filter at least in part structurally supporting the flexible substrate through the contact with the bottom surface of the base.

16. The method as defined by claim 15 wherein the substrate has a substrate opening, the filter extending through the substrate opening.

17. The method as defined by claim 15 wherein positioning a filter comprises directly contacting the filter to the bottom surface of the package.

18. The method as defined by claim 15 wherein the electrical interface of the package comprises a ground pad, the method electrically connecting the ground pad so that it is in direct contact with the substrate.

* * * * *